United States Patent
Quinn et al.

(10) Patent No.: US 9,241,415 B2
(45) Date of Patent: Jan. 19, 2016

(54) FLEXIBLE ELECTRICAL CIRCUIT ASSEMBLY FOR A MOTOR VEHICLE

(71) Applicant: GM Global Technology Operations LLC, Detroit, MI (US)

(72) Inventors: Shawn G. Quinn, Grand Blanc, MI (US); Doru N. Serban, Richmond Hill (CA); Khristopher S. Lee, Oakland Township, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 43 days.

(21) Appl. No.: 13/891,856

(22) Filed: May 10, 2013

(65) Prior Publication Data

US 2014/0331563 A1  Nov. 13, 2014

(51) Int. Cl.
*B60J 5/04* (2006.01)
*H05K 7/02* (2006.01)
*B60J 10/08* (2006.01)
*B60R 16/02* (2006.01)
*H01B 7/00* (2006.01)

(52) U.S. Cl.
CPC . *H05K 7/02* (2013.01); *B60J 10/08* (2013.01); *B60R 16/0207* (2013.01); *H01B 7/0045* (2013.01)

(58) Field of Classification Search
CPC ....... H05K 7/02; B60J 10/08; B60R 16/0207; H01B 7/0045
USPC ............ 49/502; 296/146.7, 39.1, 39.3, 146.1, 296/146.2
See application file for complete search history.

(56) References Cited

U.S. PATENT DOCUMENTS

| | | | | |
|---|---|---|---|---|
| 4,800,648 A * | 1/1989 | Nakayama et al. | ............. | 29/854 |
| 4,848,829 A * | 7/1989 | Kidd | ............. | 296/152 |
| 4,882,842 A * | 11/1989 | Basson et al. | ............. | 29/857 |
| 4,907,836 A * | 3/1990 | Ueda et al. | ............. | 296/39.1 |
| 4,942,499 A * | 7/1990 | Shibata et al. | ............. | 361/826 |
| 5,092,647 A * | 3/1992 | Ueda et al. | ............. | 296/146.9 |
| 5,460,530 A * | 10/1995 | Toba et al. | ............. | 439/34 |
| 5,473,937 A * | 12/1995 | McCluskey et al. | ............. | 73/115.02 |
| 5,588,260 A * | 12/1996 | Suzuki et al. | ............. | 49/502 |
| 5,598,627 A * | 2/1997 | Saka et al. | ............. | 29/861 |
| 5,918,365 A * | 7/1999 | Uchida et al. | ............. | 29/868 |
| 5,975,622 A * | 11/1999 | Koopman, Jr. | ............. | 296/146.1 |
| 6,000,959 A * | 12/1999 | Curtindale et al. | ............. | 439/247 |
| 6,051,790 A * | 4/2000 | Takeuchi et al. | ............. | 174/72 A |
| 6,064,003 A * | 5/2000 | Moore et al. | ............. | 174/662 |
| 6,064,014 A * | 5/2000 | McCluskey et al. | ............. | 200/83 J |
| 6,126,228 A * | 10/2000 | Davis et al. | ............. | 296/146.7 |
| 6,127,021 A * | 10/2000 | Kelman | ............. | 428/172 |

(Continued)

*Primary Examiner* — Jerry Redman
(74) *Attorney, Agent, or Firm* — Cantor Colburn LLP

(57) ABSTRACT

A flexible electrical circuit assembly for a motor vehicle includes a first flexible substrate having a first surface and an opposing second surface. The flexible electrical circuit assembly also includes a second flexible substrate having a first surface and an opposing second surface. The first surface of the second flexible substrate abuttingly joins with the second surface of the first flexible substrate. A flexible circuit member is arranged between the first and second flexible substrates. The flexible circuit member includes an input end and an output end. A first connector is electrically connected to the input end of the flexible circuit member. The first connector is configured and disposed to electrically connect with a source of electrical energy. A second connector is electrically connected to the output end of the flexible circuit member. The second connector is configured to electrically connect with an electrical component in the motor vehicle.

17 Claims, 5 Drawing Sheets

(56) References Cited

U.S. PATENT DOCUMENTS

| | | | |
|---|---|---|---|
| 6,142,556 A * | 11/2000 | Tanaka et al. | 296/146.7 |
| 6,164,160 A * | 12/2000 | Nassar | 74/606 R |
| 6,312,046 B1 * | 11/2001 | Sora et al. | 296/208 |
| 6,428,081 B1 * | 8/2002 | Williams et al. | 296/146.7 |
| 6,431,642 B2 * | 8/2002 | Sora et al. | 296/208 |
| 6,494,522 B1 * | 12/2002 | Drewniok et al. | 296/146.7 |
| 6,536,835 B2 * | 3/2003 | Murakami et al. | 296/152 |
| 6,565,142 B1 * | 5/2003 | Gibney et al. | 296/146.7 |
| 6,630,625 B1 * | 10/2003 | Akashi et al. | 174/72 A |
| 6,688,776 B2 * | 2/2004 | Simmons et al. | 385/53 |
| 7,105,748 B2 * | 9/2006 | Takase et al. | 174/72 A |
| 7,152,907 B2 * | 12/2006 | Salhoff et al. | 296/146.7 |
| 7,712,395 B2 * | 5/2010 | Suzuki et al. | 74/606 R |
| 7,805,888 B2 * | 10/2010 | Mersch et al. | 49/502 |
| 7,832,306 B2 * | 11/2010 | Suzuki et al. | 74/606 R |
| 8,487,182 B2 * | 7/2013 | Yamashita | 174/72 A |
| 2002/0041110 A1 * | 4/2002 | Odashima et al. | 296/146.7 |
| 2002/0046503 A1 * | 4/2002 | Mersch | 49/502 |
| 2002/0170235 A1 * | 11/2002 | Petroski et al. | 49/502 |
| 2004/0049988 A1 * | 3/2004 | Reul et al. | 49/502 |
| 2006/0000149 A1 * | 1/2006 | Radu et al. | 49/502 |
| 2006/0265963 A1 * | 11/2006 | Winborn | 49/502 |
| 2007/0011949 A1 * | 1/2007 | Isobe et al. | 49/475.1 |
| 2008/0265613 A1 * | 10/2008 | Hockenberry et al. | 296/146.1 |
| 2009/0145042 A1 * | 6/2009 | Mieglitz et al. | 49/502 |

\* cited by examiner

FLEXIBLE ELECTRICAL CIRCUIT ASSEMBLY FOR A MOTOR VEHICLE

FIELD OF THE INVENTION

The subject invention relates to the art of motor vehicles and, more particularly, to a flexible electric circuit assembly for a motor vehicle.

BACKGROUND

Motor vehicles include numerous systems that are coupled to a source of electrical energy. Numerous wiring harnesses extend between components and the source of electrical energy carrying power and/or control signals. Often times, the wiring harnesses are passed through panels, posts and other structure in the vehicle. Over time, the harnesses may rub on the panels, posts or other structure lessening reliability. In addition, as the complexity of motor vehicles increases, the need for a greater number of wiring harnesses also increases. Routing multiple harnesses through the vehicle can be cumbersome, add to production time, and may increase the likelihood that a wire in the wiring harness could become damaged during installation or over time during operation of the vehicle. Accordingly, it is desirable to provide a system for providing electrical connections in a motor vehicle that is less bulky, simplifies installation and increases reliability.

SUMMARY OF THE INVENTION

In accordance with one exemplary embodiment, a flexible electrical circuit assembly for a motor vehicle includes a first flexible substrate formed from a first material. The first flexible substrate includes a first surface and an opposing second surface. The flexible electrical circuit assembly also includes a second flexible substrate formed from a second material. The second flexible substrate includes a first surface and an opposing second surface. The first surface of the second flexible substrate abuttingly joins with the second surface of the first flexible substrate. A flexible circuit member is arranged between the first and second flexible substrates. The flexible circuit member includes an input end and an output end. A first connector is electrically connected to the input end of the flexible circuit member. The first connector is configured and disposed to electrically connect with a source of electrical energy in the motor vehicle. A second connector is electrically connected to the output end of the flexible circuit member. The second connector is configured and disposed to electrically connect with an electrical component in the motor vehicle.

In accordance with another exemplary embodiment, a motor vehicle component includes a body including a substrate, an electrical component mounted to the substrate, and a flexible electrical circuit assembly electrically connected to the electrical component. The flexible electrical circuit assembly includes a first flexible substrate formed from a first material. The first flexible substrate includes a first surface mounted across the substrate and an opposing, second surface. The flexible electrical circuit assembly also includes a second flexible substrate formed from a second material. The second flexible substrate includes a first surface and an opposing second surface. The first surface of the second flexible substrate abuttingly joins with the second surface of the first flexible substrate. A flexible circuit member is arranged between the first and second flexible substrates. The flexible circuit member includes an input end and an output end. A first connector is electrically connected to the input end of the flexible circuit member. The first connector is configured and disposed to electrically connect with a source of electrical energy in the motor vehicle. A second connector is electrically connected to the output end of the flexible circuit member. The second connector is electrically connected with the electrical component.

The above features and advantages and other features and advantages of the invention are readily apparent from the following detailed description of the invention when taken in connection with the accompanying drawings.

BRIEF DESCRIPTION OF THE DRAWINGS

Other features, advantages and details appear, by way of example only, in the following detailed description of embodiments, the detailed description referring to the drawings in which.

DESCRIPTION OF THE EMBODIMENTS

Figure 1:
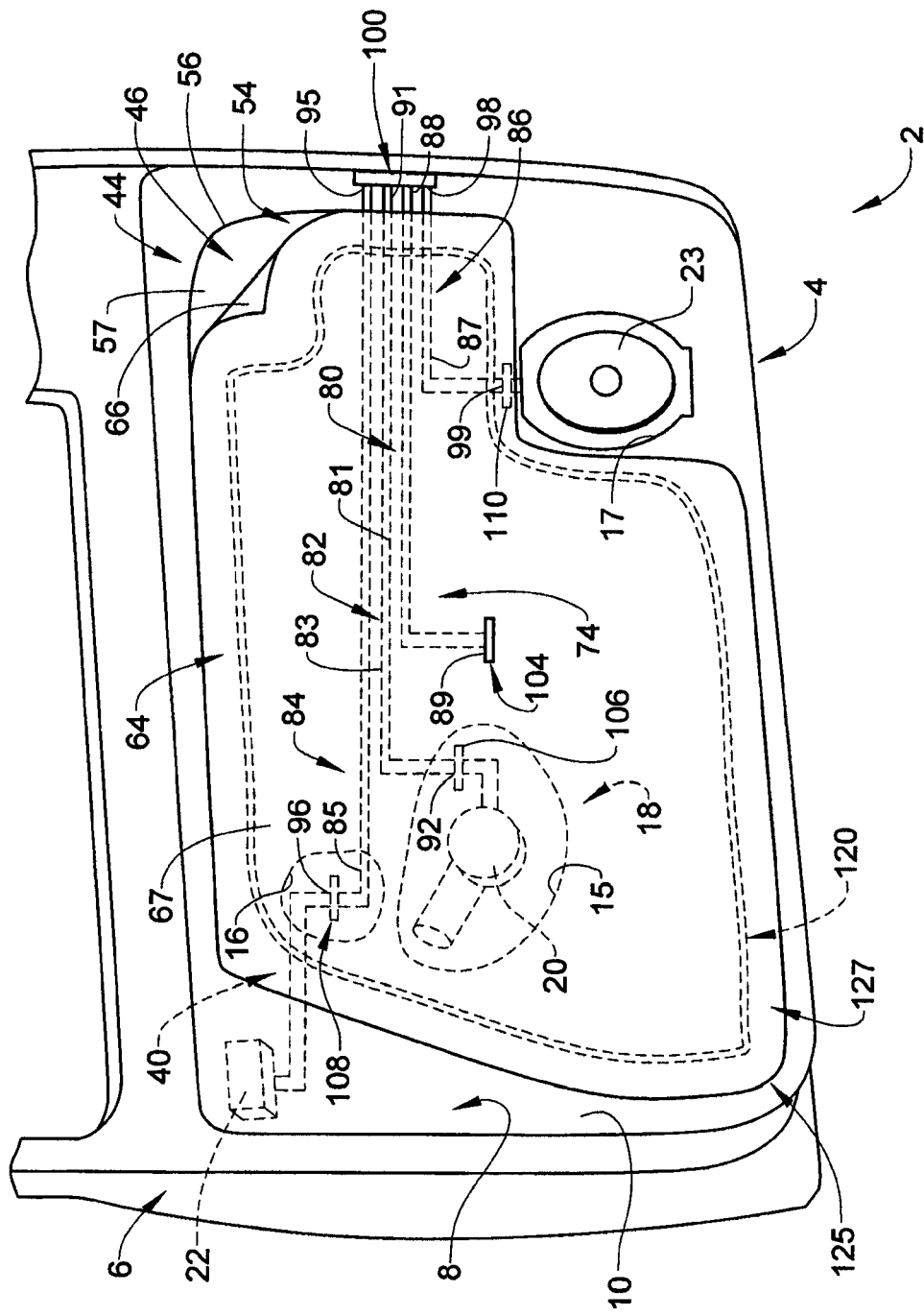
FIG. 1 is a perspective view of a first side of a motor vehicle component including a flexible electrical circuit assembly in accordance with an exemplary embodiment.

The following description is merely exemplary in nature and is not intended to limit the present disclosure, its application or uses. It should be understood that throughout the drawings, corresponding reference numerals indicate like or corresponding parts and features. A motor vehicle component in accordance with an exemplary embodiment is indicated generally at 2 in FIG. 1. Motor vehicle component 2 takes the form of a door component 4 including a body 6 having a substrate 8. Substrate 8 includes a first or passenger compartment facing surface 10 and a second or external facing surface (not separately labeled). The second surface supports an external body panel (not shown). Substrate 8 includes a plurality of openings three of which are indicated at 15, 16, and 17. Openings 15 and 16 provide passage for electrical connections, as will become more readily apparent below. Substrate 8 supports a plurality of electrical components 18. Electrical components 18 may take the form of a window regulator 20, a door lock actuator 22 and/or a door mounted speaker 23. Door mounted speaker 23 may be arranged in opening 17.

Figure 2:
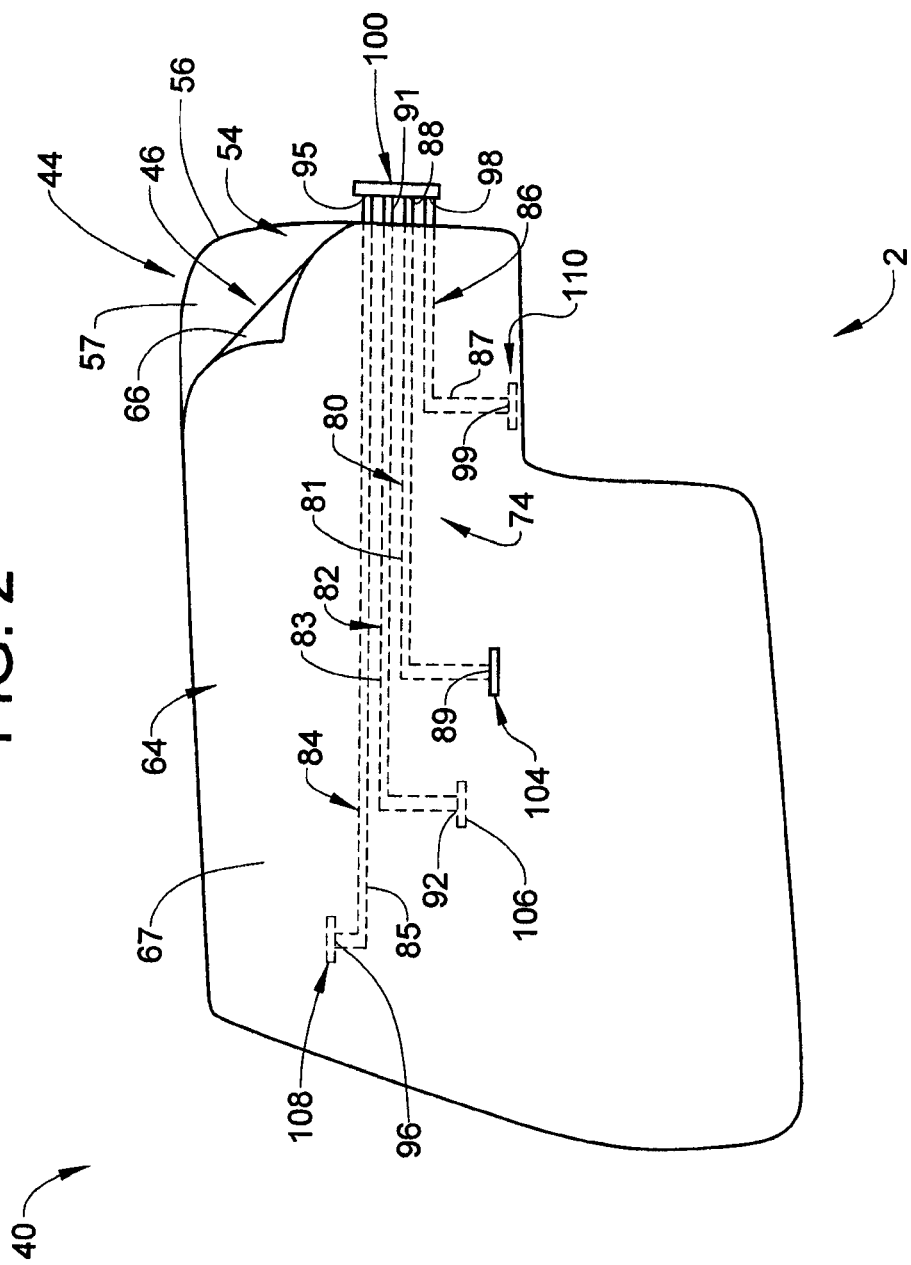
FIG. 2 is a partially disassembled perspective view of the flexible electrical circuit assembly of FIG. 1.

In accordance with an exemplary embodiment, motor vehicle component 2 is provided with a flexible electrical circuit assembly 40. Flexible electrical circuit assembly 40 replaces bulky wiring harnesses that require routing through, and around, substrate 8. As best shown in FIG. 2, flexible electrical circuit assembly 40 includes a first flexible substrate 44 and a second flexible substrate 46. First flexible substrate 44 is formed from a first material 54 and includes a first surface 56 and an opposing, second surface 57. In accordance with an aspect of the exemplary embodiment, first material 54 is a water resistant and/or water repellent material. In accordance with another aspect of the exemplary embodiment, first material 54 includes a biaxially-oriented polyethylene terephthalate (BoPet) such as Mylar®. Second flexible substrate 46 is formed from a second material 64 and includes a first surface 66 and an opposing, second surface 67. First surface 66 of second flexible substrate 46 is abuttingly joined with second surface 57 of first flexible substrate 44. In accordance with another aspect of the exemplary embodiment, second material 64 is similar to first material 54. However, it should be understood, that first and second materials 54 and 64 may differ.

In further accordance with the exemplary embodiment, flexible electrical circuit assembly 40 includes a plurality of flexible circuit members 74 positioned between first and second flexible substrates 44 and 46. In the exemplary embodiment shown, flexible electrical circuit assembly 40 includes a first flexible circuit member 80 including a first flexible electric trace 81, a second flexible circuit member 82 including a second flexible electric trace 83, a third flexible circuit member 84 including a third flexible electric trace 85, and a fourth flexible circuit member 86 including a fourth flexible electrical trace 87. Each flexible electrical trace 81, 83, 85 and 87 is formed from a flexible Mylar. Of course, other flexible trace materials such as thin copper or other electrically conductive material may also be employed. Also, while shown as including two conductors, it should be understood that the number of conductors in each flexible electrical trace 81, 83, 85 and 87 may vary.

First flexible electrical trace 81 includes a first input end 88 and a first output end 89. Second flexible electrical trace 83 includes a second input end 91 and a second output end 92. Third flexible electrical trace 85 includes a third input end 95 and a third output end 96. Fourth flexible electrical trace 87 includes a fourth input end 98 and a fourth output end 99. First, second, third, and fourth input ends 88, 91, 95, and 98 are electrically coupled to a first connector 100. First connector 100 may mounted to second substrate 46 at an outer peripheral edge of flexible electrical circuit assembly 40. First connector 100 is configured to electrically connect flexible electrical circuit assembly 40 to a wire harness (not shown) that passes through a hinge pillar (also not shown) of a motor vehicle.

First output end 89 is connected to a second connector 104 mounted to second substrate 46. Second output end 92 is connected to a third connector 106 provided on first substrate 44. Third output end 96 is connected to a fourth connector 108 also provided on second substrate 46. Fourth output end 99 is connected to a fifth connector 110 provided on first substrate 44. Third and fourth connectors 106 and 108 are positioned to correspond to openings 15 and 16 while fifth connector 110 is arranged proximate to opening 17. Thus, third connector 106 is configured to electrically connect with window regulator 20, fourth connector 108 is coupled to door lock actuator 22 and fifth connector 110 is configured to couple to the door speaker 23. First connector 104 is configured to connect with a door mounted control (not shown).

In further accordance with the exemplary embodiment, flexible electrical circuit assembly 40 includes a bead of adhesive 120 that extends about an outer periphery of first surface 56 of flexible substrate 44. Bead of adhesive 120 secures flexible electrical circuit assembly 40 to substrate 8. Alternatively, bead of adhesive 120 may be replaced by adding an adhesive to entirely cover first surface 56 of flexible substrate 44. In this manner, flexible electrical circuit assembly 40 acts as a waterproof barrier 125 mounted to substrate 8.

More specifically, in the configuration shown in FIG. 1, flexible electrical circuit assembly 40 serves as a water deflector 127 that prevents water from passing through door component 4 into a passenger compartment of a motor vehicle. Flexible electrical circuit assembly 40 also provides a simple, easy to install, and connect electrical interface between door mounted electrical component 18 and a source of electrical energy/signals (not shown).

At this point, it should be understood, that the flexible electrical circuit assembly in accordance with the exemplary embodiment replaces the need to install and route multiple electrical wiring harnesses through a motor vehicle component. In addition to replacing wiring harnesses, the flexible electrical circuit assembly may be formed from BoPet and also serve as a water barrier, thereby further reducing the number of components necessary to complete a motor vehicle assembly. Thus, the flexible electrical circuit assembly not only reduces manufacturing complexity, but also reduces the number of parts needed for production. In addition, by eliminating the need to route wire harnesses through openings formed in the vehicle component, the flexible electrical circuit assembly reduces potential failure points and the need to protect wire components from sharp edges thereby further reducing the cost and complexity of manufacturing a motor vehicle.

Figure 3:
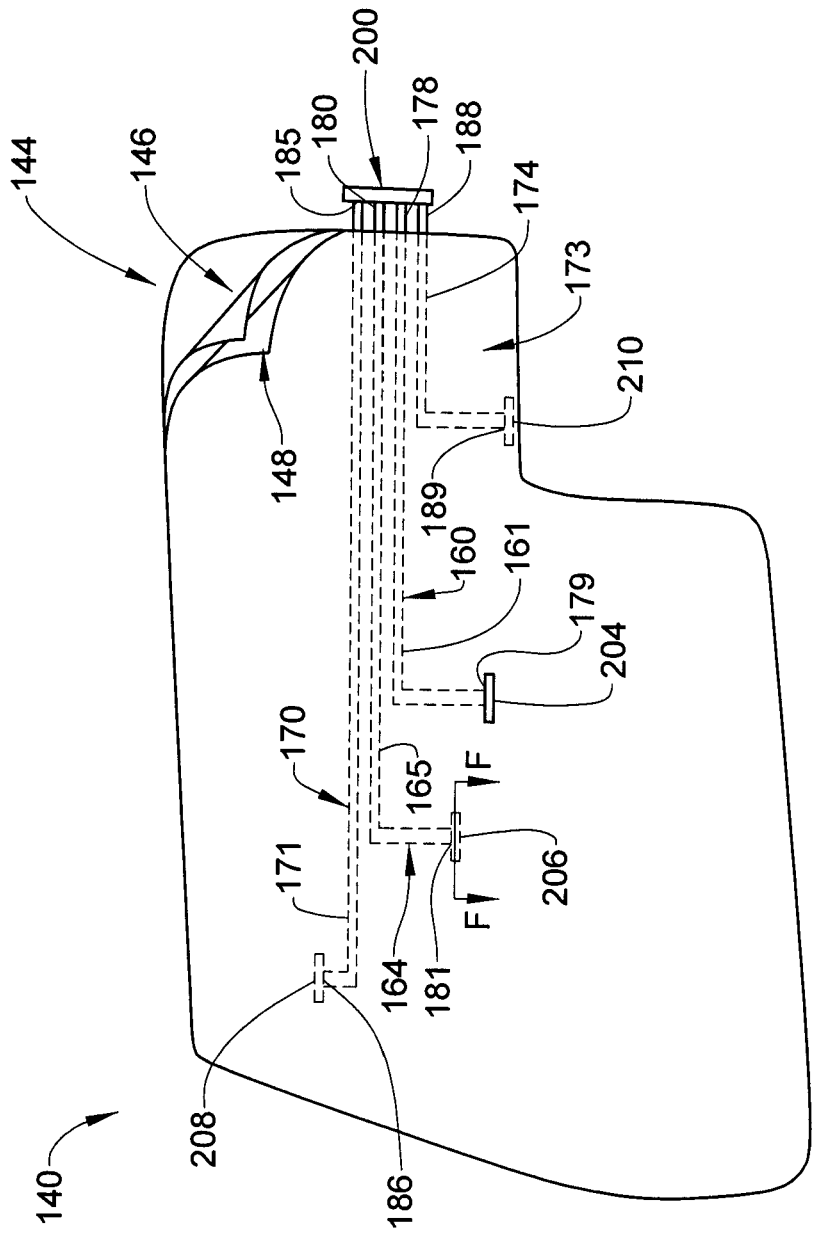
FIG. 3 is a partially disassembled perspective view of a flexible electrical circuit assembly in accordance with another aspect of the exemplary embodiment.

Further, while shown as including two layers, a flexible electric circuit assembly 140 may include a first flexible substrate 144, a second flexible substrate 146 and a third flexible substrate 148 as shown in FIG. 3. A first flexible circuit member 160 including a first flexible trace 161 may be positioned between first and second flexible substrates 144 and 146. In addition, a second flexible circuit member 164 including a second flexible trace 165, a third flexible circuit member 170 having a third flexible electrical trace 171 may be arranged between second and third flexible substrates 146 and 148, and a fourth flexible electrical circuit member 173 including a fourth flexible electrical trace 174 may be arranged between first and second flexible substrates 144 and 146. As will be discussed more fully below, each electrical trace may have a conductor arranged between two different flexible substrates. First flexible electrical trace 161 includes a first input end 178 and a first output end 179. Second flexible electrical trace 165 includes a second input end 180 and a second output end 181, third flexible electrical trace 170 includes a third input end 185 and a third output end 186 and fourth flexible electrical trace includes a fourth input end 188 and a fourth output end 189.

Input ends 178, 180, 185 and 188 are electrically coupled to a first connector 200. First connector 200 may be mounted to an outer peripheral edge (not separately labeled) of flexible electrical circuit assembly 140. First connector 200 is configured to electrically connect flexible electrical circuit assembly 40 to a wire harness (not shown) that passes through a hinge pillar (also not shown) of a motor vehicle. First output end 179 is electrically coupled to a second connector 204, second output end 181 is electrically coupled to a third connector 206, third output end 186 is electrically coupled to a fourth connector 208 and fourth output end 189 is electrically coupled to a fifth connector 210.

Figure 4:
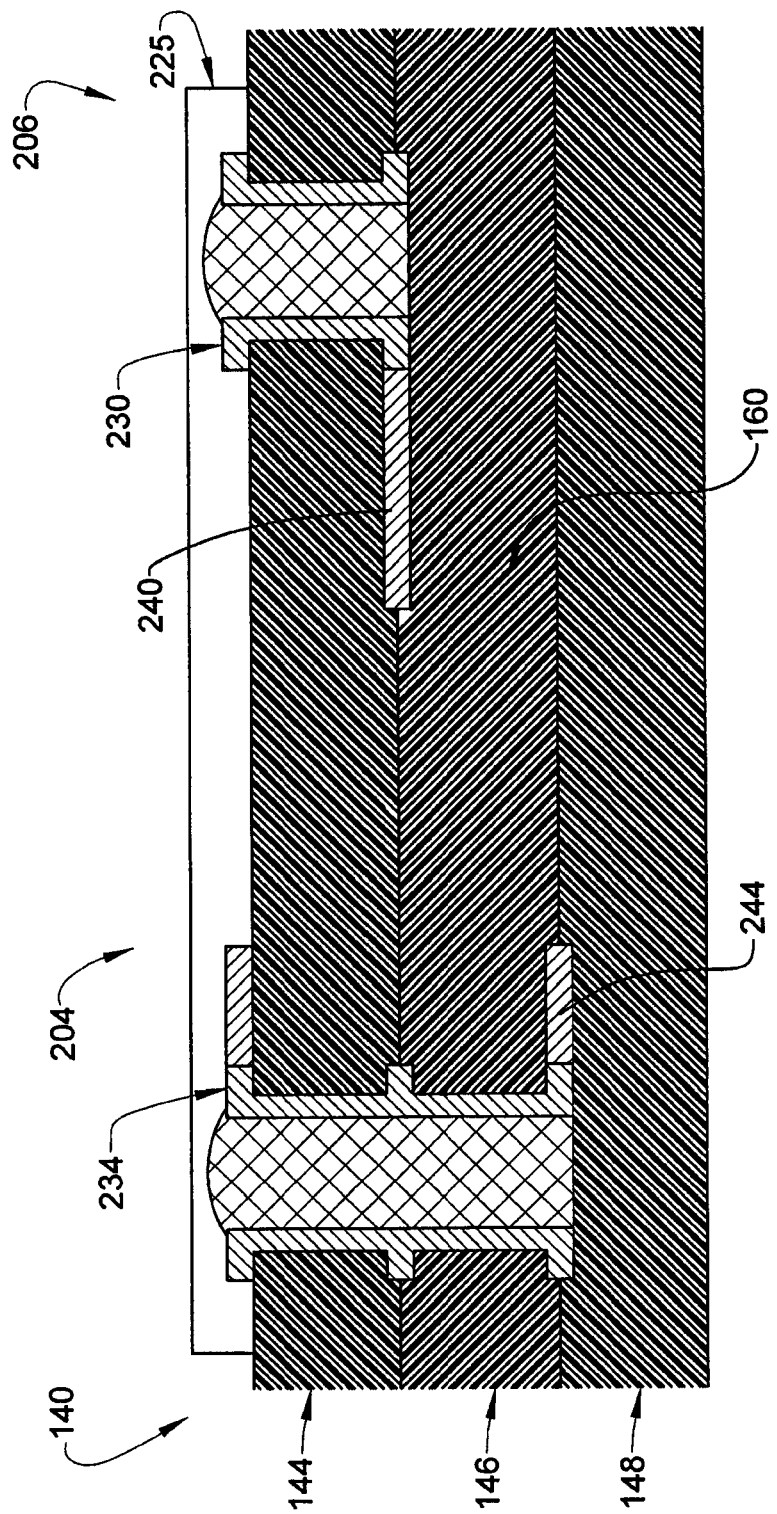
FIG. 4 is a cross-sectional side view of the flexible electrical circuit assembly taken through the line F-F of FIG. 3, illustrating a connector arrangement in accordance with an aspect of the exemplary embodiment.

A detailed description of second electrical connector 204 will follow with reference to FIG. 4. It should be understood that third, fourth, fifth electrical connectors 206, 208 and 210 may include similar or alternate connection arrangements. Connector 204 includes a connector body 225 mounted to first flexible substrate 144. Connector body 225 includes a first terminal 230 and a second terminal 234. First terminal 230 extends through first flexible substrate 144 to a first conductor 240 of first flexible circuit member 160 and second terminal 234 extends through first and second flexible substrates 144 and 146 and connects with a second conductor 244 of first flexible circuit member 160. At this point it should be understood that the number, type and location of terminals may vary. It should also be understood that connector body 225 may include terminals (not shown) that extend entirely through flexible electric circuit assembly 140 and/or terminals (also not shown) that are fully embedded in flexible electric circuit assembly 140 and provide for through connections and/or internal connections between conductors respectively.

Figure 5:
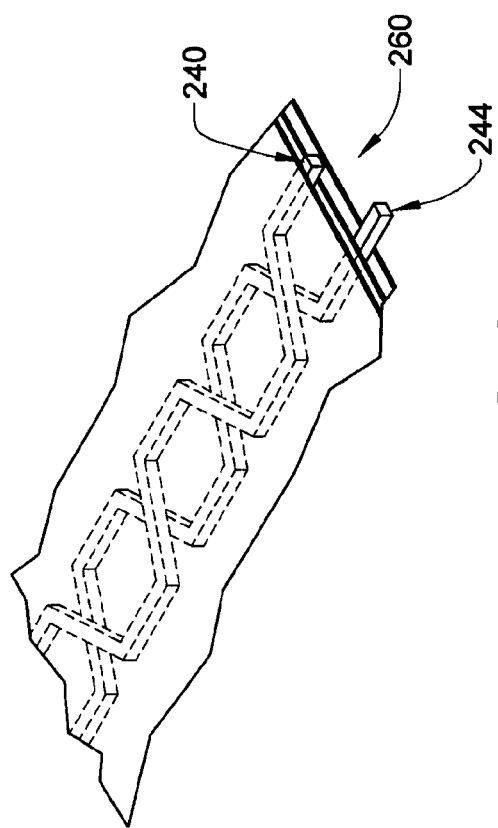
FIG. 5 illustrates conductors arranged in the flexible electrical circuit assembly of FIG. 3, in accordance with an aspect of the exemplary embodiment.
Figure 6:
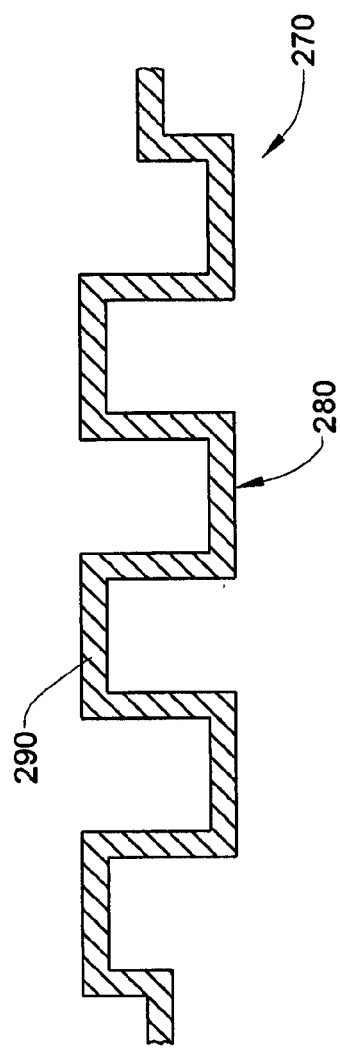
FIG. 6 illustrates a conductor arranged in the flexible electrical circuit assembly of FIG. 3, in accordance with another aspect of the exemplary embodiment.

FIG. 5 illustrates first conductor 240 and second conductor 244 arranged as a pseudo twisted pair 260. More specifically, as shown in FIG. 4, first conductor 240 is arranged between first and second flexible substrates 144 and 146 and second conductor 244 is arranged between second and thirst flexible substrates 146 and 148. The particular arrangement shown in FIG. 5 produces an electrical effect similar to that achieved by twisting together two conductors. In addition to forming pseudo twisted pairs, it should be understood that an electrical conductor, such as shown at 270 in FIG. 6 could be arranged in a form track 280 creating a small value resistor 290.

It should be understood that the number of flexible substrates may vary. It should also be understood that the term "motor vehicle" includes passenger cars, passenger trucks, work vehicles, and other transport systems including overland, over water and air transport systems. It should be further understood that while described as being formed from BoPet, the flexible substrates may be formed from other materials. It should also be understood that the flexible electrical traces may be formed from thin copper, insulated copper wires, or other electrical conducting materials.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed, but that the invention will include all embodiments falling within the scope of the application.

What is claimed is:

1. A flexible electrical circuit assembly for a motor vehicle comprising:
    a first flexible substrate formed from a first pliable material, the first flexible substrate including a first surface and an opposing second surface;
    a second flexible substrate formed from a second pliable material, the second flexible substrate including a first surface and an opposing, second surface, the first surface of the second flexible substrate abuttingly joining with the second surface of the first flexible substrate;
    a flexible circuit member arranged between and abutting the first and second flexible substrates, the flexible circuit member including an input end and an output end;
    a first connector electrically connected to the input end of the flexible circuit member, the first connector being configured and disposed to electrically connect with a source of electrical energy in the motor vehicle;
    a second connector electrically connected to the output end of the flexible circuit member, the second connector being configured and disposed to electrically connect with an electrical component in the motor vehicle;
    a third flexible substrate formed from a third material, the third flexible substrate including a first surface and an opposing, second surface, the first surface of the third flexible substrate abutting the second surface of the second flexible substrate; and
    another flexible circuit member arranged between the second flexible substrate and the third flexible substrate.

2. The flexible electrical circuit assembly according to claim 1, wherein the flexible circuit member includes one or more flexible electrical traces extending between the first and second flexible substrates.

3. The flexible electrical circuit assembly according to claim 1, wherein the first connector is provided on the first flexible substrate.

4. The flexible electrical circuit assembly according to claim 3, wherein the second connector is provided on one of the first and second flexible substrates.

5. The flexible electrical circuit assembly according to claim 3, wherein the second connector is provided on the second flexible substrate.

6. The flexible electrical circuit assembly according to claim 1, wherein the first pliable material comprises a first water resistant material.

7. The flexible electrical circuit assembly according to claim 6, further comprising: an adhesive provided on one of the first and second flexible substrates.

8. The flexible electrical circuit assembly according to claim 7, wherein the one of the first and second flexible substrates is secured to a panel of the motor vehicle through the adhesive, the flexible electrical circuit assembly providing a waterproof barrier between the panel and a passenger compartment of the motor vehicle.

9. The flexible electrical circuit assembly according to claim 1, further comprising: a bead of adhesive extending about one of the first and second flexible substrates, the bead of adhesive being configured and disposed to support the flexible electrical circuit assembly in the motor vehicle.

10. The flexible electrical circuit assembly according to claim 1, wherein the flexible electrical circuit assembly comprises a water deflector mounted to a door of the motor vehicle.

11. A motor vehicle component comprising:
    a body including a substrate;
    an electrical component mounted to the substrate; and
    a flexible electrical circuit assembly electrically connected to the electrical component, the flexible electrical circuit assembly comprising:
        a first flexible substrate formed from a first pliable material, the first flexible substrate including a first surface mounted across the substrate and an opposing second surface;
        a second flexible substrate formed from a second pliable material, the second flexible substrate including a first surface and an opposing second surface, the first surface of the second flexible substrate abuttingly joining with the second surface of the first flexible substrate;
        a flexible circuit member arranged between and abutting the first and second flexible substrates, the flexible circuit member including an input end and an output end;
        a first connector electrically connected to the input end of the flexible circuit member, the first connector being configured and disposed to electrically connect with a source of electrical energy in the motor vehicle; and a second connector electrically connected to the output end of the flexible circuit member, the second connector being electrically connected with the electrical component;

a third flexible substrate formed from a third material, the third flexible substrate including a first surface and an opposing, second surface, the first surface of the third flexible substrate abutting the second surface of the second flexible substrate; and another flexible circuit member arranged between the second flexible substrate and the third flexible substrate.

12. The flexible electrical circuit assembly according to claim 11, wherein the flexible circuit member includes one or more flexible electrical traces extending between the first and second flexible substrates.

13. The flexible electrical circuit assembly according to claim 11, wherein the first pliable material comprises a first water resistant material and the second pliable material comprises a second water resistant material.

14. The flexible electrical circuit assembly according to claim 13, further comprising: an adhesive provided on the first surface of the first flexible substrate, the bead of adhesive joining the flexible electrical circuit assembly to the substrate.

15. The flexible electrical circuit assembly according to claim 11, wherein the substrate includes a first side, an opposing second side, and at least one opening extending between the first and second sides, the electrical component being mounted to the first side and the flexible electrical circuit assembly being mounted to the second side across the at least one opening.

16. The flexible electrical circuit assembly according to claim 15, wherein the first connector is provided on the first flexible substrate and electrically connected to the electrical component and the second connector is provided on the second flexible substrate.

17. The flexible electrical circuit assembly according to claim 11, wherein the motor vehicle component comprises a vehicle door component, the flexible electrical circuit assembly comprising a water deflector mounted to the vehicle door component, the water deflector being configured and disposed to prevent water passing through the door into a passenger compartment of the motor vehicle.

* * * * *